United States Patent
Griswold et al.

(10) Patent No.: US 8,542,012 B2
(45) Date of Patent: *Sep. 24, 2013

(54) THROUGH-TIME NON-CARTESIAN GRAPPA CALIBRATION

(76) Inventors: Mark A. Griswold, Shaker Heights, OH (US); Jeffrey Duerk, Avon Lake, OH (US); Nicole Seiberlich, Shaker Heights, OH (US)

(*) Notice: Subject to any disclaimer, the term of this patent is extended or adjusted under 35 U.S.C. 154(b) by 689 days.

This patent is subject to a terminal disclaimer.

(21) Appl. No.: 12/693,605

(22) Filed: Jan. 26, 2010

(65) Prior Publication Data

US 2011/0089946 A1    Apr. 21, 2011

Related U.S. Application Data

(63) Continuation-in-part of application No. 12/582,871, filed on Oct. 21, 2009.

(51) Int. Cl.
*G01R 33/385* (2006.01)

(52) U.S. Cl.
USPC .................. 324/309; 324/307; 324/318

(58) Field of Classification Search
USPC .. 324/300–322; 600/407–435; 382/128–131
See application file for complete search history.

(56) References Cited

U.S. PATENT DOCUMENTS

| | | | | |
|---|---|---|---|---|
| 7,439,739 | B2 * | 10/2008 | Beatty | 324/309 |
| 7,583,082 | B1 * | 9/2009 | Hu et al. | 324/309 |
| 8,116,541 | B2 * | 2/2012 | Brau et al. | 382/128 |
| 8,184,879 | B2 * | 5/2012 | Geier et al. | 382/128 |
| 2008/0012562 | A1 * | 1/2008 | Beatty | 324/307 |
| 2008/0279433 | A1 * | 11/2008 | Brau et al. | 382/131 |
| 2009/0196478 | A1 * | 8/2009 | Lustig et al. | 382/131 |
| 2010/0034447 | A1 * | 2/2010 | Geier et al. | 382/131 |
| 2010/0142823 | A1 * | 6/2010 | Wang et al. | 382/195 |
| 2010/0182009 | A1 * | 7/2010 | Crozier et al. | 324/322 |
| 2011/0089946 | A1 * | 4/2011 | Griswold et al. | 324/309 |
| 2011/0093233 | A1 * | 4/2011 | Griswold et al. | 702/106 |

* cited by examiner

*Primary Examiner* — Melissa Koval
*Assistant Examiner* — Tiffany Fetzner

(57) ABSTRACT

Example systems and methods control a parallel magnetic resonance imaging (pMRI) apparatus to acquire non-Cartesian (e.g., spiral) calibration data sets throughout time. Example systems and methods also control the pMRI apparatus to acquire an under-sampled non-Cartesian data set from the object to be imaged. Example systems and methods then control the pMRI apparatus to reconstruct an image of the object to be imaged from the under-sampled non-Cartesian data set. The reconstruction depends, at least in part, on a through-time non-Cartesian GRAPPA calibration where a value for a point missing from k-space in the under-sampled non-Cartesian data set is computed using a GRAPPA weight set calibrated and applied for the missing point. The GRAPPA weight set is computed from data in the non-Cartesian calibration data sets.

24 Claims, 8 Drawing Sheets

THROUGH-TIME NON-CARTESIAN GRAPPA CALIBRATION

CROSS-REFERENCE TO RELATED APPLICATIONS

This U.S. Continuation-In-Part Patent Application claims priority to and the benefit of U.S. patent application Ser. No. 12/582,871 filed Oct. 21, 2009, which is incorporated herein by reference in its entirety.

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Conventional generalized auto-calibrating partially parallel acquisitions (GRAPPA) generates uncombined coil images for each coil in an array of receive coils used by a parallel magnetic resonance imaging (pMRI) apparatus. GRAPPA reconstructs missing lines in each coil element by forming linear combinations of neighboring lines to reconstruct individual missing data points. The weights for these linear combinations are derived by forming a fit between additionally acquired lines using a pseudo-inverse operation. GRAPPA is described in Griswold, et al., Proceedings of the ISMRM, Vol. 7, Issue 6, Pg. 1202-1210 (2002).

Conventional non-Cartesian GRAPPA acquires data and makes a reconstruction kernel comprised of GRAPPA weights. The reconstruction kernel is used to reconstruct acquisition path elements acquired during a radial reconstruction. The quality of a non-Cartesian GRAPPA reconstruction depends, at least in part, on whether a suitable reconstruction kernel that corresponds to an acquisition path element being reconstructed is available. Radial GRAPPA is described in Griswold et al., Proc. ISMRM 11, 2003, p2349. While the radial trajectory provides a useful testbed for non-Cartesian trajectories, other non-Cartesian trajectories are possible. Non-Cartesian GRAPPA can include acquisition paths that include, for example, spiral acquisitions, rosette acquisitions, and so on.

An under-sampled radial acquisition will not acquire every possible ray in a radial pattern. Assuming that 360 rays are available, one for each degree in a circle associated with a radial pattern, a fully sampled data set would acquire a ray at multiple rotations (e.g., 0 degrees, 1 degree, 2 degrees). However, in an under-sampled radial acquisition, less than every ray will be acquired. For example, rays may be acquired at 0 degrees, 2 degrees, 4 degrees, and so on. Therefore there are rays missing at 1 degrees, 3 degrees, and so on. However, these missing rays can be filled in using conventional techniques to produce acceptable results. Similarly, an under-sampled spiral acquisition will not acquire every possible spiral and an under-sampled rosette acquisition will not acquire every possible rosette.

An acknowledged but tolerable error associated with conventional reconstruction assumes that a ray for 0 degrees is useful for reconstructing a neighboring ray at, for example 1 degree. Similarly, a first spiral may be useful for reconstructing a neighboring, missing spiral. This assumption holds for rays and spirals that are closely spaced as is the case when relatively mild under-sampling factors are used. However, when the two rays or two other acquisition path elements get too far apart (e.g., 0 degrees and ten degrees) this assumption and reconstruction approach no longer produces acceptable results. Also, the assumption is weaker at the edge of k-space where points are farther apart than at the center of k-space where points may intersect or nearly overlap. The review of GRAPPA provided below facilitates understanding this neighbor based approach and its shortcomings at high acceleration factors.

To better understand radial GRAPPA and the example systems and methods described below, a brief history of GRAPPA, starting at SMASH (Simultaneous Acquisition of Spatial Harmonics) is provided. FIG. 1 illustrates basic reconstruction of data in a single coil. The read-out direction is left to right. In both SMASH and VD-AUTO-SMASH a single line of data acquired in each coil in an array of receive coils in a pMRI apparatus is fit to an auto-calibration signal (ACS) line in the composite image. In VD-AUTO-SMASH this process is repeated several times and the results are averaged together to form final reconstruction weights for a reconstruction kernel that is used for reconstructing missing points. In the VD-AUTOSMASH approach, more than one ACS line is acquired in the center of k-space. This allows for multiple fits to be performed for each missing line, thereby moderating the effects of both noise and coil profile imperfections. In addition to the improved fit provided by the VD-AUTO-SMASH approach, the extra ACS lines can be included in the final image, thereby further reducing image artifacts. In both AUTO-SMASH and VD-AUTO-SMASH, as well as the original SMASH technique, the fitting process determines the weights that transform a single line acquired in each of the individual coils into a single shifted line in the composite k-space matrix. This process is shown schematically in FIG. 1. The data acquired in each coil (black circles) are fit to the ACS line in a composite image (gray circle), which in most cases is the simple sum of the ACS lines acquired in each coil.

FIG. 2 illustrates the basic GRAPPA algorithm. In GRAPPA, more than one line acquired in each of the coils in the array are fit to an ACS line acquired in a single coil of the array. In the example illustrated, four acquired lines are used to fit a single ACS line in coil number four. In GRAPPA, uncombined images are generated for each coil in the array by applying multiple block-wise reconstructions to generate the missing lines for each coil. In GRAPPA, a block is defined as a single acquired line plus the missing lines adjacent to that line as shown on the right of FIG. 2. Data acquired in each coil of the array (black circles) are fit to the ACS line (gray circles). However, data from multiple lines from all coils are used to fit an ACS line in a single coil, in this case an ACS line from coil four. This fit gives weights that can then be used to generate the missing lines from that coil. Once all of the lines are reconstructed for a particular coil, a Fourier transform can be used to generate the uncombined image for that coil. Once this process is repeated for each coil of the array, the full set of uncombined images can be obtained, which can then be combined using a normal sum of squares reconstruction.

Performing the reconstruction requires determining the weights to be used in the reconstruction. As in VD-AUTO-SMASH, a block of extra ACS lines is acquired in the center of k-space and used to determine the complex weights.

Conventional parallel imaging techniques may fill in omitted k-space lines prior to Fourier transformation by constructing a weighted combination of neighboring lines acquired by the different RF detector coils. Conventional parallel imaging techniques may also first Fourier transform an under-sampled k-space data set to produce an aliased image from each coil and then unfold the aliased signals by a linear transformation of the superimposed pixel values.

Non-Cartesian imaging has advantages over standard Cartesian imaging due to, for example, efficient k-space coverage or suppression of off-resonance effects. However, points acquired in a non-Cartesian approach do not necessarily fall onto a grid and thus have conventionally been re-sampled onto a Cartesian matrix before a Fourier transform is performed. One example gridding technique is the self-calibrating GRAPPA operator gridding (GROG) method. Using GROG, non-Cartesian MRI data is gridded using spatial information from a multichannel coil array without an additional calibration dataset. Using self-calibrating GROG, the non-Cartesian data points are shifted to nearby k-space locations using parallel imaging weight sets determined from the data points themselves. GROG employs the GRAPPA Operator, a special formulation of the general reconstruction method GRAPPA, to perform these shifts. While this re-gridding produces acceptable results in radial trajectories at low acceleration factors, at higher acceleration factors it may yield sub-optimal results.

Re-gridding has been employed in Radial GRAPPA, (Griswold, et al., "Direct Parallel Imaging Reconstruction Of Radially Sampled Data Using GRAPPA With Relative Shifts," Proceedings of the ISMRM $11^{th}$ Scientific Meeting, Toronto, 2003: 2349). Radial GRAPPA improves on conventional pMRI processing using non-Cartesian trajectories. Recall that GRAPPA determined a linear combination of individual coil data to create missing lines of k-space. GRAPPA determined the coefficients for the combination by fitting the acquired data to some over-sampled data near the center of k-space. The over-sampled data is acquired using ACS lines.

With conventional radial GRAPPA, a preliminary fully sampled scan is first performed to acquire training data that is used to estimate the missing radial data. This training data can then be used throughout a real-time scan to estimate radial lines that were not sampled. In order to calculate the required weights, multiple points in the region are used together to solve for the required number of unknown weights. Given a typical number of unknowns (e.g., 240 unknowns), a typical region size could include 8 rays and 32 points along the ray. The configuration of the different points is assumed to be the same within each region. A weight set is then derived for each region and the reconstruction is performed region by region. Note that this weight solution is the best fit solution for all of the points in the region, which is in effect correct only for the average point configuration in the region. In practical implementations, this means that some level of error is distributed to every reconstruction in the region. In addition, because only a single fully sampled data set is used for calibration, and because of its intrinsic sensitivity to variations in the point structure within each region, conventional radial GRAPPA has relied on high quality fully sampled training data that may have required extensive signal averaging. Conventionally, this acquisition may have been impractical for certain applications (e.g., contrast enhanced dynamic studies). Additionally, the errors resulting from too widely separated acquired rays has limited the maximal undersampling possible with radial GRAPPA. Similar errors may result in other non-Cartesian GRAPPA, including in spiral GRAPPA, where the distance between spiral interleaves may be so large that the regional assumption may also break down.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
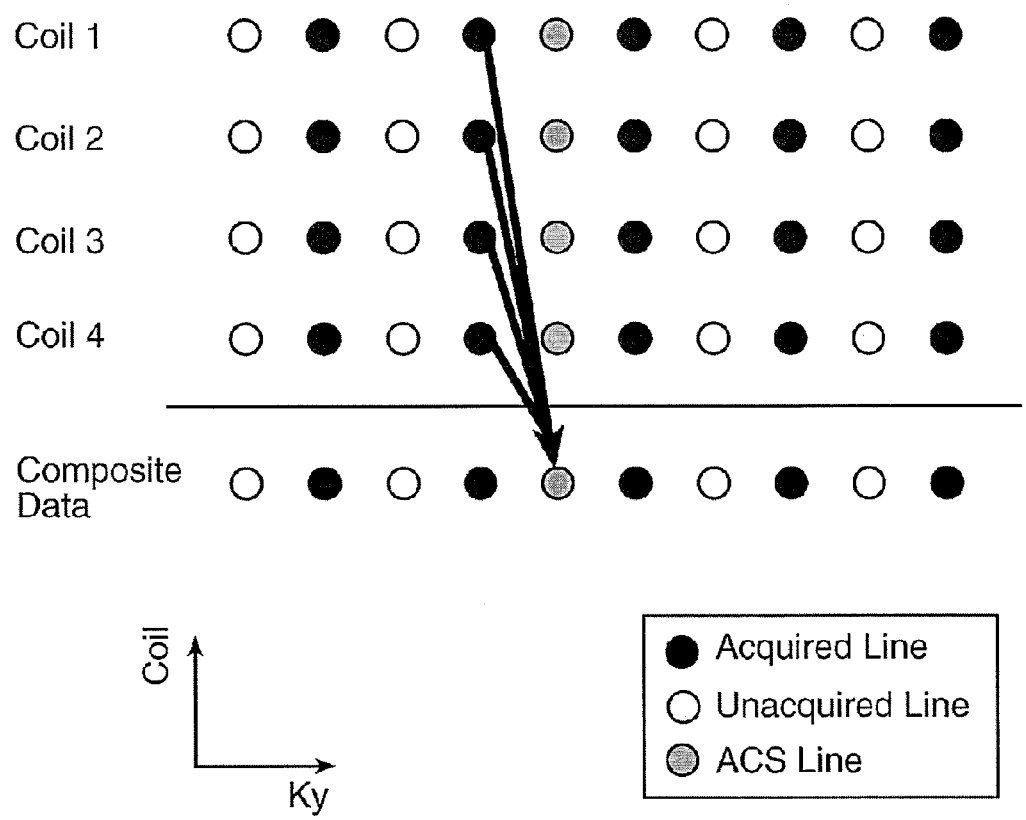
FIG. 1 illustrates basic reconstruction of data in a single coil.
Figure 2:
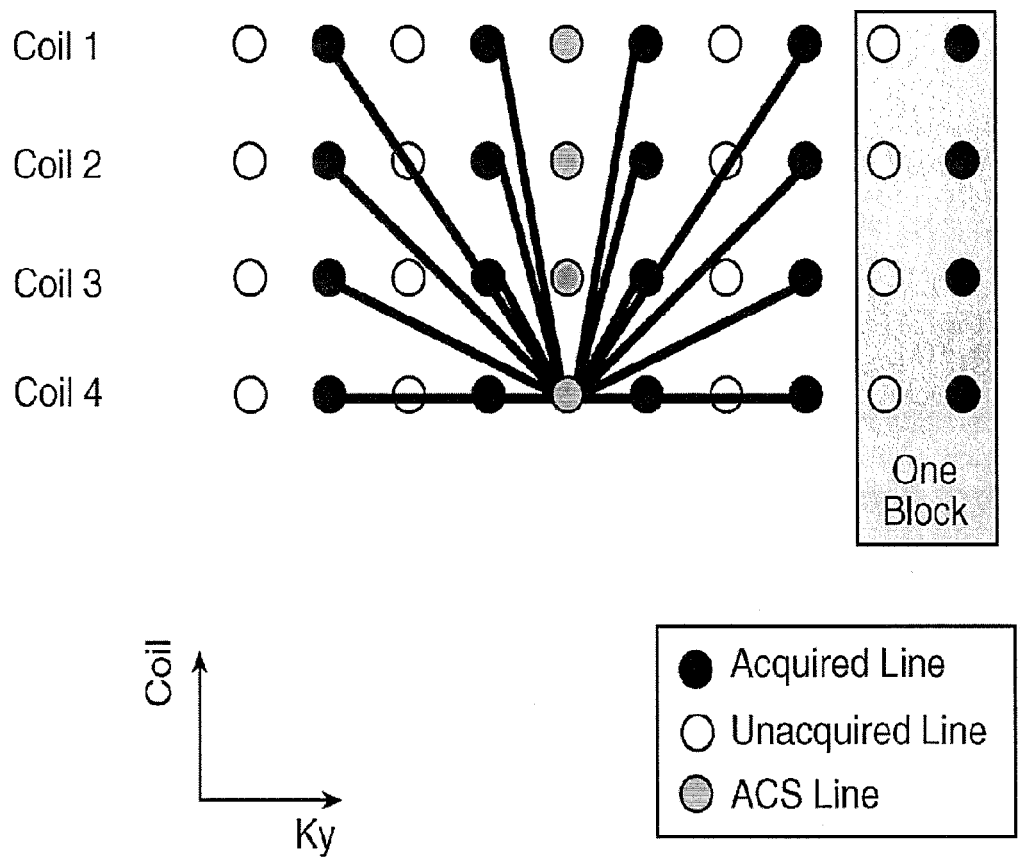
FIG. 2 illustrates the basic GRAPPA algorithm.

Example systems and methods acquire calibration data at different points in time and perform a through-time calibration for non-Cartesian GRAPPA. Non-Cartesian GRAPPA may involve acquisition paths including, but not limited to, spiral trajectories, rosette trajectories, and so on. The calibration data may be fully sampled calibration sets but may also be less than fully sampled calibration data sets. By acquiring calibration data through time, multiple copies of each point can be acquired. Using these multiple copies, one can derive a separate reconstruction kernel for each desired reconstruction point in the raw data. Because an exact kernel configuration can be calculated for each point, the resulting reconstruction kernel will support higher acceleration factors for under-sampling than previously thought possible for non-Cartesian GRAPPA. The calibration data is acquired according to a plan that acquires acquisition path elements that are in the same configuration as acquisition path elements that will be used in a reconstruction. Since data is acquired through time, the reconstruction kernel may be exact for the acquisition path elements that are acquired multiple times through time.

By repeatedly acquiring calibration data for an acquisition path element throughout a period of time, a point in k-space to be solved for using the reconstruction kernel can be successfully reconstructed based on the high quality calibration data. Consider a calibration data set that acquires a calibration spiral for 0 degrees rotation and for 5 degrees rotation at several points in time. At each point in time there will be a spiral for zero degrees and a spiral for five degrees. While the calibration data set need not be fully sampled, it will be configured to have the same configuration as the reconstruction kernel. This means that if a reconstruction will rely on spirals for 0 degrees, 5 degrees, 10 degrees, . . . , then the calibration data set will acquire, through time, multiple copies of calibration data for the reconstruction kernel spirals. The reconstruction kernel constructed from these repeatedly acquired spirals can be very accurate. While spirals are described, one skilled in the art will appreciate that other non-Cartesian acquisition trajectories may be employed.

At high acceleration factors (e.g., R>4), conventional non-Cartesian GRAPPA may experience artifacts that render an image substantially unusable. Recall that in radial GRAPPA, segments of radial k-space can be approximated as Cartesian segments during parallel imaging reconstruction. However, at large acceleration factors the Cartesian approximation may not hold up, yielding the unacceptable artifacts.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Signal", as used herein, includes but is not limited to, electrical signals, optical signals, analog signals, digital signals, data, computer instructions, processor instructions, messages, a bit, a bit stream, or other means that can be received, transmitted and/or detected.

Example systems and methods control a parallel magnetic resonance imaging (pMRI) apparatus to acquire a set of non-Cartesian calibration data and to perform a through-time calibration based, at least in part, on the set of non-Cartesian calibration data. In one example, the calibration data may be fully sampled. However, a fully sampled data set is not required. Example systems and methods control the pMRI apparatus to acquire multiple data sets, where a data set will have at least the same acquisition path elements that will be used in a reconstruction kernel. For example, if a reconstruction kernel is going to rely on data for a spiral at 0 degrees rotation, at 5 degrees rotation, at 10 degrees rotation, at 15 degrees rotation, and so on, then multiple data sets that include data on at least those spiral rotations will be acquired. The calibration data sets will be acquired at different points in time.

In one embodiment, since the multiple data sets are acquired at multiple points in time, the calibration data used to build the reconstruction kernel can be very accurate. At each point in time there will be a calibration data set for each acquisition path element used in the reconstruction kernel. This facilitates creating an improved reconstruction kernel having improved GRAPPA weights, which in turn facilitates reducing artifacts in reconstructions of highly under-sampled non-Cartesian GRAPPA. Returning to the example above, if 240 weights are required, then instead of assembling at least 240 different points in the region to solve for the weights, assemble 240 separate acquisitions in time. In each case, the different points would then be assembled into a set of linear equations that describe the relationship between different acquired points and a potential reconstructed points. The system of equations is then solved for the required weights. The difference between the two methods is that the weights would be in error for each of the reconstructed points in the former region-based case. By contrast, example apparatuses and methods described herein facilitate deriving an exact set of weights using through-time calibration.

Figure 3:
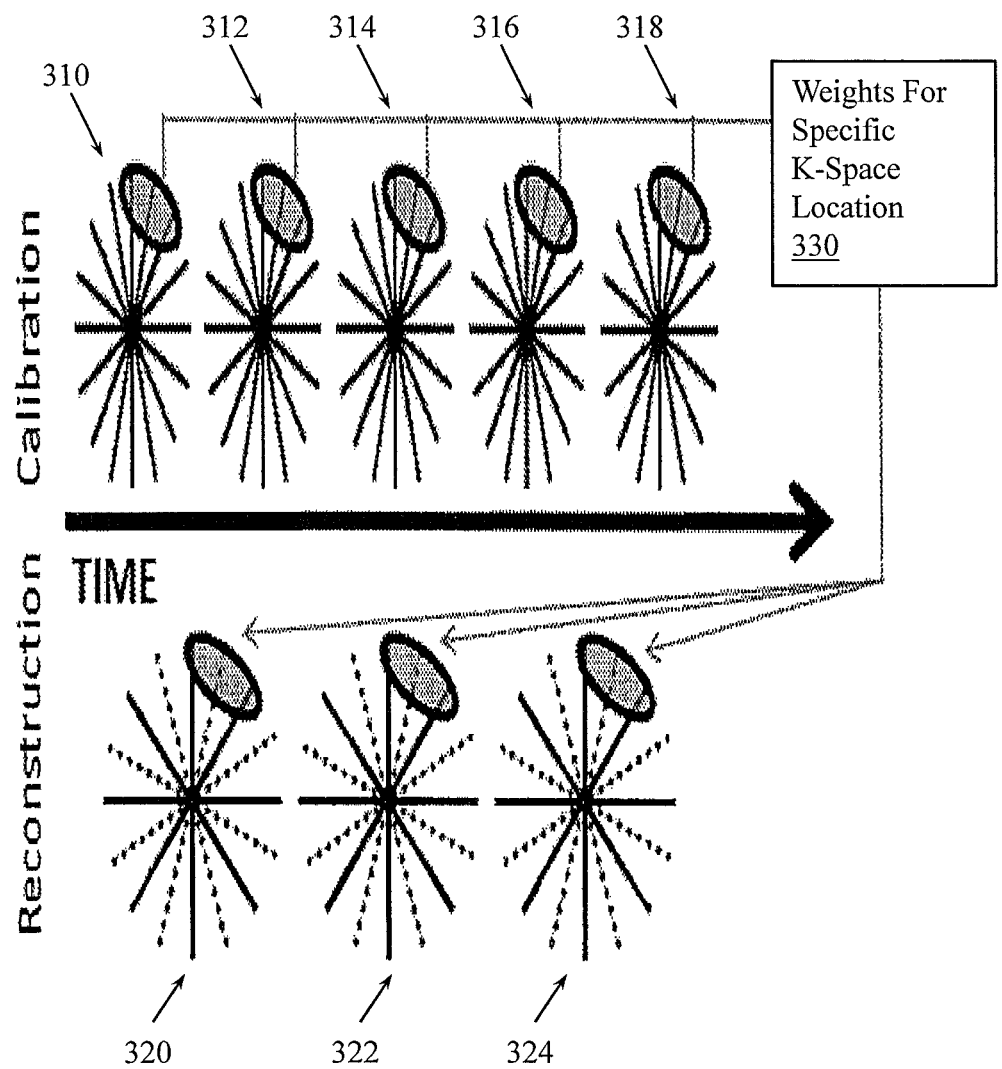
FIG. 3 illustrates through-time non-Cartesian GRAPPA calibration.

Performing a through-time time calibration could also be referred to as calibrating the pMRI with a set of calibration data acquired at different points over a period of time. FIG. 3 illustrates how calibration data is acquired through time. FIG. 3 also illustrates how a calibration data set is acquired and then an under-sampled data set is acquired. The under-sampled data set can be reconstructed using selected weights associated with calibration data acquired at different points in time. For example, a reconstruction can use weights from an immediately preceding calibration data set, from an immediately following calibration data set, from a combination of the before and after calibration data sets, from all the calibration data sets, and so on. A weight set for each missing point can be calibrated and applied separately. While FIG. 3 illustrates a set of radial acquisitions, one skilled in the art will appreciate that other acquisition paths may be employed.

In one embodiment, the through-time calibration facilitates producing weights 330 for specific locations in k-space. The weights may be computed from calibration data sets 310, 312, 314, 316, and 318. While five calibration data sets are illustrated, one skilled in the art will appreciate that a greater and/or lesser number of calibration data sets may be employed. The weights may then be employed to reconstruct under-sampled data sets 322, 324, and 326. In FIG. 3, the calibration data sets 310-318 are illustrated being interleaved with the under-sampled data sets 322-326. One skilled in the art will appreciate that in a different embodiment, all the calibration data sets 310-318 could be acquired first and then all the under-sampled data sets 322-326 could be acquired and reconstructed.

Figure 4:
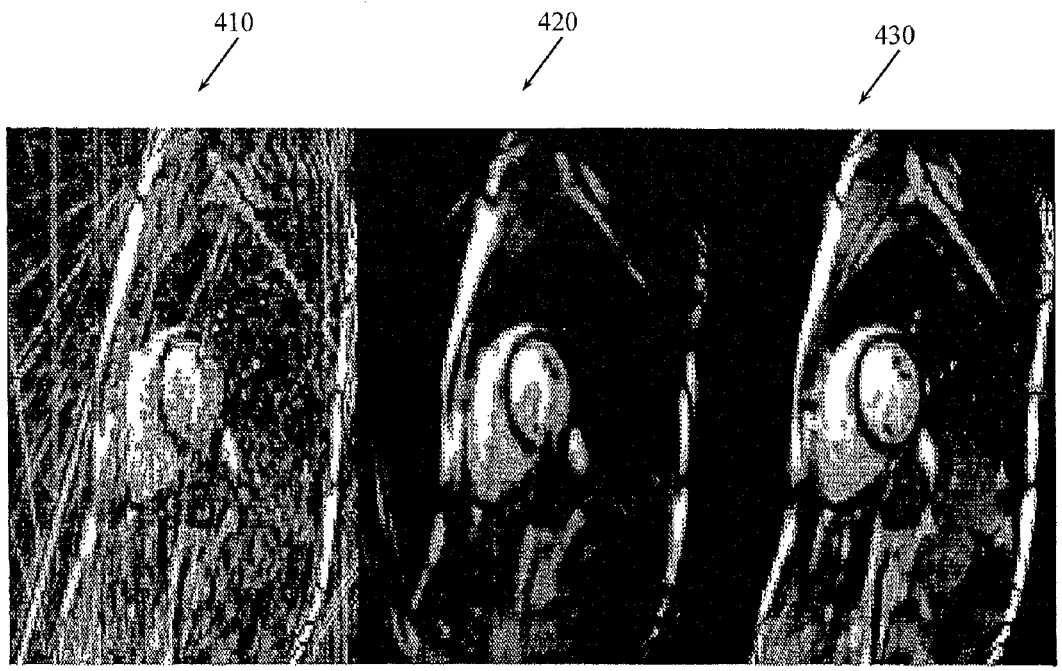
FIG. 4 illustrates images reconstructed using conventional non-Cartesian GRAPPA and using non-Cartesian GRAPPA associated with a through-time non-Cartesian GRAPPA calibration.

FIG. 4 illustrates example reconstructions for an acceleration factor of 8. The leftmost image 410 represents a cardiac dataset. The middle image 420 represents a standard non-Cartesian GRAPPA reconstruction. The rightmost image 430 represents a non-Cartesian GRAPPA reconstruction associated with a through-time calibration. The image 430 illustrates sharp edges and an absence of streak artifacts.

Data associated with a reconstructed image, with GRAPPA weights employed for computing a reconstructed image, and with calibration data associated with computing the GRAPPA weights can be stored on a computer-readable medium. The reconstructed image represents items including, for example, human bones, human tissues, human blood, and so on. In one example, a computer-readable medium may store, in a first field, data representing a non-Cartesian calibration data set acquired by a pMRI apparatus. The non-Cartesian calibration data set is acquired from an object to be imaged (e.g., heart, knee, lung, vasculature). The computer-readable medium may also store, in a second field, data representing an under-sampled non-Cartesian data set acquired by the pMRI apparatus. The under-sampled non-Cartesian data set is also acquired from a real-world physical object (e.g., heart, lung). The computer-readable medium may also store, in a third field, data representing GRAPPA weights calibrated for a point missing in the under-sampled non-Cartesian data set. The GRAPPA weights in the third field are computed from data in the first field and are applied to data in the second field.

Figure 5:
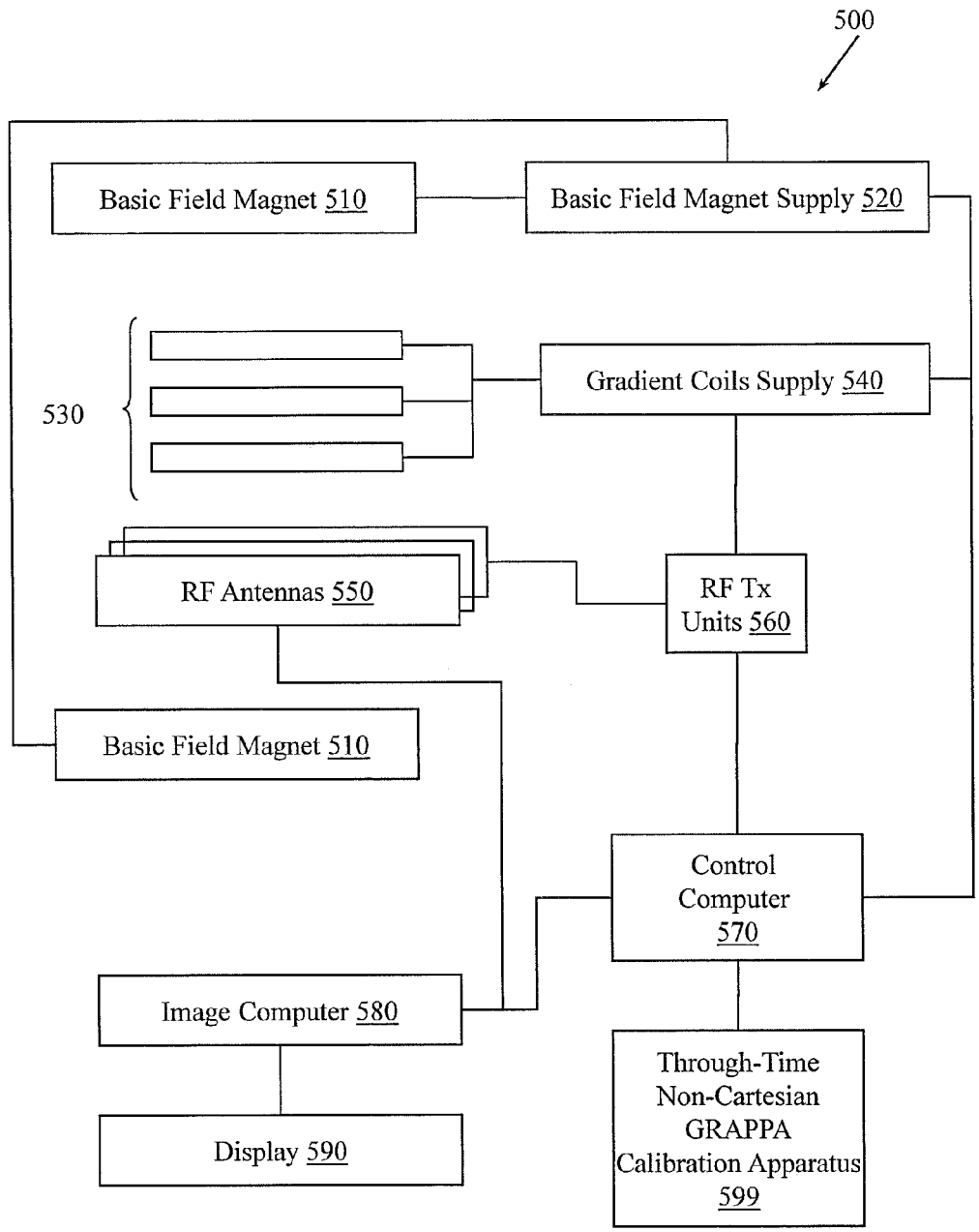
FIG. 5 illustrates an apparatus associated with through-time non-Cartesian GRAPPA calibration.

FIG. 5 illustrates an example MRI apparatus 500 configured with a through-time non-Cartesian GRAPPA calibration apparatus 599. The apparatus 599 may be configured with elements of example apparatus described herein and/or may perform example methods described herein. The apparatus 500 includes a basic field magnet(s) 510 and a basic field magnet supply 520. Ideally, the basic field magnets 510 would produce a uniform $B_0$ field. However, in practice, the $B_0$ field may not be uniform, and may vary over an object being imaged by the MRI apparatus 500. MRI apparatus 500 may include gradient coils 530 configured to emit gradient magnetic fields like $G_S$, $G_P$ and $G_R$. The gradient coils 530 may be controlled, at least in part, by a gradient coils supply 540. In some examples, the timing, strength, and orientation of the gradient magnetic fields may be controlled, and thus selectively adapted during an MRI procedure.

MRI apparatus 500 may include a set of RF antennas 550 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 550 may be controlled, at least in part, by a set of RF transmission units 560. An RF transmission unit 560 may provide a signal to an RF antenna 550.

The gradient coils supply 540 and the RF transmission units 560 may be controlled, at least in part, by a control computer 570. In one example, the control computer 570 may be programmed to control a pMRI device as described herein. The magnetic resonance signals received from the RF antennas 550 can be employed to generate an image and thus may be subject to a transformation process. The transformation can be performed by an image computer 580 or other similar processing device. The image data may then be shown on a display 590. While FIG. 5 illustrates an example MRI apparatus 500 that includes various components connected in various ways, it is to be appreciated that other MRI apparatus may include other components connected in other ways.

Figure 6:
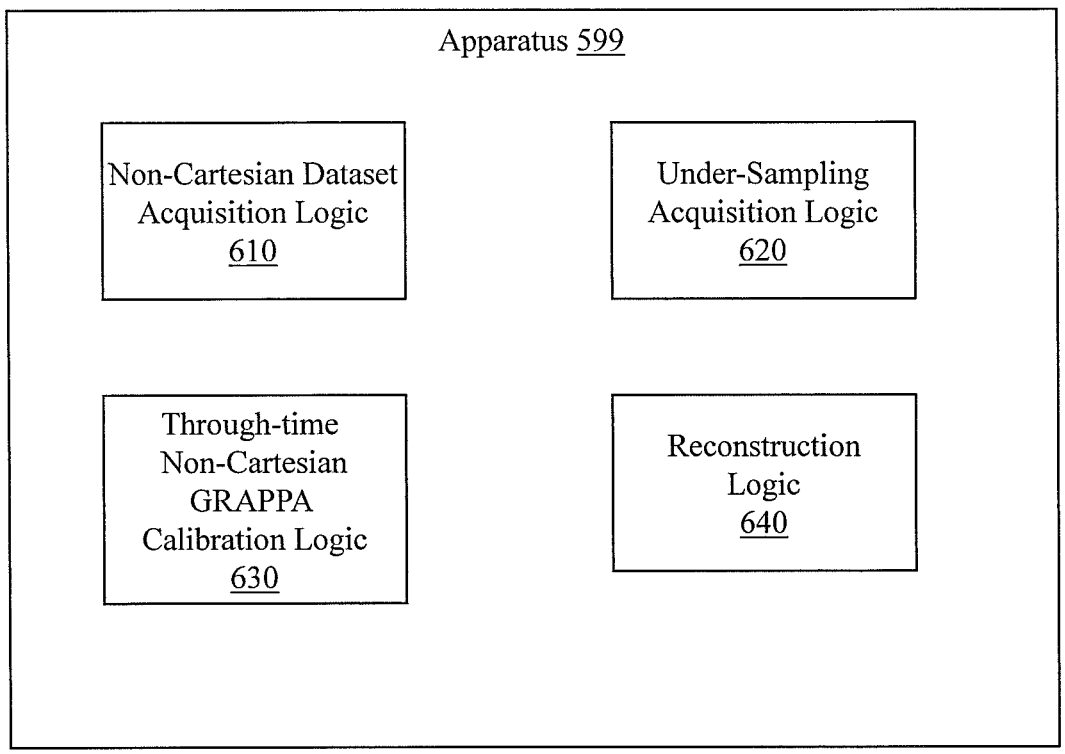
FIG. 6 illustrates an apparatus associated with through-time non-Cartesian GRAPPA calibration.

FIG. 6 illustrates one embodiment of apparatus 599. The embodiment of apparatus 599 illustrated in FIG. 6 includes a non-Cartesian dataset acquisition logic 610. The non-Cartesian dataset acquisition logic 610 is configured to control a parallel magnetic resonance imaging (pMRI) apparatus (e.g., apparatus 500) to acquire a plurality of non-Cartesian (e.g., spiral, rosette) calibration data sets. Members of the plurality of non-Cartesian calibration data sets are acquired at different points in time.

Apparatus 599 also includes an under-sampling acquisition logic 620. Under-sampling acquisition logic 620 is configured to acquire an under-sampled non-Cartesian data set from the object to be imaged. Due to the through-time non-Cartesian GRAPPA calibration described herein, under-sampling acquisition logic 620 can acquire under-sampled non-Cartesian data sets using a larger acceleration factor (e.g., R=8) than is conventionally possible.

Apparatus 599 also includes a through-time non-Cartesian GRAPPA calibration logic 630. Through-time non-Cartesian GRAPPA calibration logic 630 is configured to compute a GRAPPA weight set for a point missing from k-space in the under-sampled non-Cartesian data set. The GRAPPA weight set is calibrated for the missing point and computed from data in the plurality of non-Cartesian calibration data sets. In one embodiment, the through-time non-Cartesian GRAPPA calibration logic 630 is configured to compute a value for each point missing from k-space in the under-sampled non-Cartesian data set using a GRAPPA weight set calibrated and applied for each missing point. Thus, one skilled in the art will appreciate that each point may have its own GRAPPA weight set. In one embodiment, the GRAPPA weight set is computed from data selected from each member of the plurality of non-Cartesian calibration data sets. In another embodiment, the GRAPPA weight set is computed from data selected from less than each member of the plurality of non-Cartesian calibration data sets. One skilled in the art will appreciate that in different embodiments different calibration data can be used to compute the GRAPPA weight set.

The non-Cartesian dataset acquisition logic 610 is configured to acquire non-Cartesian calibration data sets comprising two or more acquisition path elements for which calibration data is acquired. In one example, one of the elements is an element that would be acquired in the under-sampled data, while the other could be one that would be skipped in the under-sampled acquisition. Thus the two or more elements are selected based on elements that will be used to reconstruct the image. The two or more elements will be used by the reconstruction logic 640 to reconstruct the image and will be used by the through-time non-Cartesian GRAPPA calibration logic 630 to compute the GRAPPA weight set. In different embodiments a non-Cartesian calibration data set may include 2, 4, 8 and other numbers of elements. In some embodiments the elements may be evenly spaced, while in other embodiments the elements may not be evenly spaced.

In one embodiment, the through-time non-Cartesian GRAPPA calibration logic 630 can be configured to compute the GRAPPA weight set from all the elements acquired in the non-Cartesian calibration data sets. In another embodiment, the through-time non-Cartesian GRAPPA calibration logic 630 can be configured to compute the GRAPPA weight set from less than all the elements acquired in the non-Cartesian calibration data sets. In different embodiments the non-Cartesian calibration data sets can be fully sampled data sets or less than fully sampled data sets. In different embodiments, through-time calibration can also be based, at least in part, on a small amount of conventional region based calibration. Region based calibration uses at least one other k-space point assembled from a region around a given k-space point as a target point for calibration. This type of region based calibration is proposed in original radial GRAPPA publications. As mentioned above, this conventional method alone can work well for small regions, but fails for larger regions required for higher accelerations. Thus the combination of a small region of k-space point with a through-time calibration method may provide better performance than either method alone.

Apparatus 599 also includes a reconstruction logic 640. Reconstruction logic 640 is configured to reconstruct an image from the under-sampled non-Cartesian data set. The reconstruction will depend, at least in part on the GRAPPA weight sets.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 7:
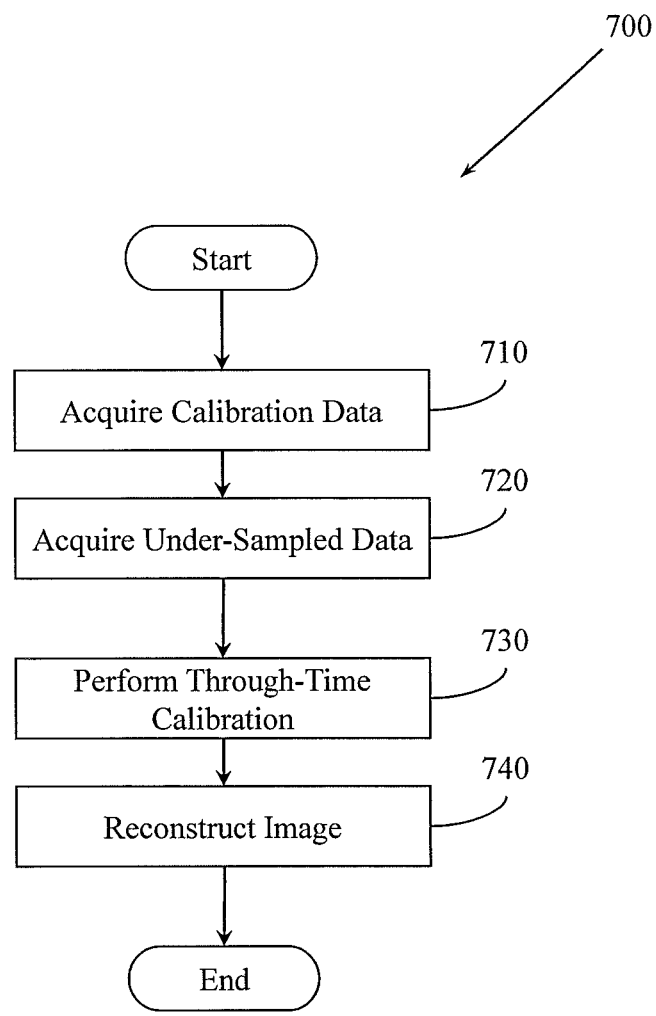
FIG. 7 illustrates a method associated with through-time non-Cartesian GRAPPA calibration.

FIG. 7 illustrates a method 700 associated with through-time non-Cartesian GRAPPA calibration. Method 700 includes, at 710, controlling a parallel magnetic resonance imaging (pMRI) apparatus to acquire calibration data. The calibration data is acquired from an object to be imaged throughout a period of time. The calibration data comprises two or more non-Cartesian calibration data sets. The non-Cartesian calibration data sets can be associated with, for example, spiral acquisitions, rosette acquisitions, and so on. The non-Cartesian calibration data sets are acquired at the same point on the acquisition path element at different points in time. A non-Cartesian calibration data set comprises two or more elements for which calibration data is acquired. In one example, the GRAPPA weight set is computed from all the elements acquired in the non-Cartesian calibration data set. In another example, the GRAPPA weight set is computed from less than all the elements acquired in the non-Cartesian calibration data set. The two or more elements can be carefully selected. For example, the elements can be selected based on elements that will be used to reconstruct the image. In one example, the two or more elements include at least the elements that will be used to reconstruct the image. A non-Cartesian calibration data set can be a fully-sampled data set or a data set that is less than fully-sampled.

Method 700 also includes, at 720, controlling the pMRI apparatus to acquire an under-sampled non-Cartesian (e.g., spiral, rosette) data set from the object to be imaged. One skilled in the art will appreciate that there are different methods for acquiring an under-sampled non-Cartesian data set.

Method 700 also includes, at 730, controlling the pMRI apparatus to perform a through-time non-Cartesian GRAPPA calibration. The through-time non-Cartesian GRAPPA calibration includes computing a GRAPPA weight set from data in the two or more calibration data sets. In one example, the through-time non-Cartesian GRAPPA calibration includes computing a value for each point missing from k-space in the under-sampled non-Cartesian data set using a GRAPPA weight set calibrated and applied for each missing point. In different examples, the GRAPPA weight set can be computed from data selected from each of the two or more non-Cartesian calibration data sets and/or from less than each of the two or more non-Cartesian calibration data sets. For example, non-Cartesian calibration data sets may be selected based on proximity in time to an under-sampled data set, based on a sliding window of time in which non-Cartesian calibration data sets are acquired, based on complete coverage, and so on.

Method 700 also includes, at 740, controlling the pMRI apparatus to reconstruct an image of the object to be imaged from the under-sampled non-Cartesian data set. A value for a point missing from k-space in the under-sampled non-Cartesian data set is computed using the GRAPPA weight set as calibrated and applied for the missing point. In one example, the image can be reconstructed in real-time. Real-time reconstruction is useful in applications where the object to be imaged is, for example, a beating heart, a lung, a region of a human vasculature in which blood is flowing, and so on. In these examples, the two or more non-Cartesian calibration data sets can be acquired from the object to be imaged at different points in time throughout a period of time during which the object to be imaged moves. Unlike conventional systems that rely on additional external timing, in method 700 the non-Cartesian calibration data sets are acquired from the object to be imaged without reference to an EKG gating signal and/or while the object to be imaged is breathing normally without breath-holding. In different embodiments, the calibration data and the under-sampled data can be acquired in different ways. For example, method 700 can include controlling the pMRI apparatus to acquire all the non-Cartesian calibration data sets and then to acquire the under-sampled non-Cartesian data set or to interleave acquisition of the non-Cartesian calibration data sets and the under-sampled non-Cartesian data set.

While FIG. 7 illustrates various actions occurring in serial, it is to be appreciated that various actions illustrated in FIG. 7 could occur substantially in parallel. By way of illustration, a first process could acquire calibration data, a second process could acquire under-sampled data, a third process could perform a through-time non-Cartesian GRAPPA calibration, and a fourth process could reconstruct an under-sampled image based on GRAPPA weights computed during the through-time non-Cartesian GRAPPA calibration. While four processes are described, it is to be appreciated that a greater and/or lesser number of processes could be employed and that lightweight processes, regular processes, threads, and other approaches could be employed.

Figure 8:
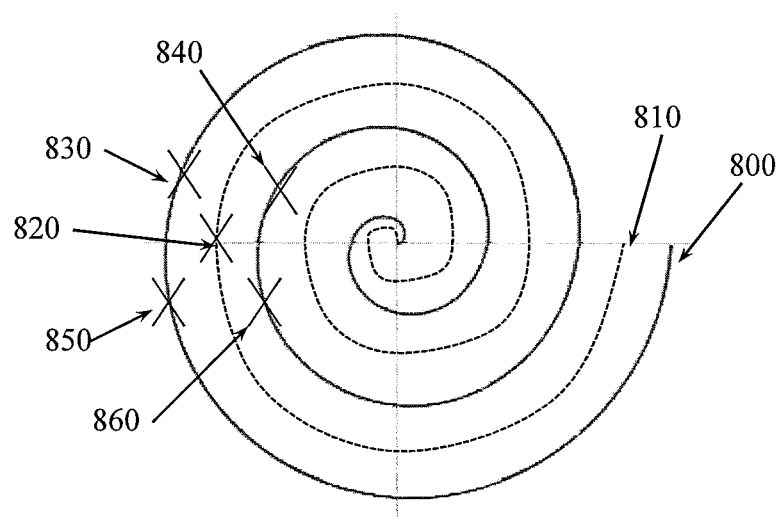
FIG. 8 illustrates a spiral acquisition.

In one example, a method may be implemented as computer executable instructions. Thus, in one example, a computer-readable medium may store computer executable instructions that if executed by a machine (e.g., processor) cause the machine to perform method 700. While executable instructions associated with the method 700 are described as being stored on a computer-readable medium, it is to be appreciated that executable instructions associated with other example methods described herein may also be stored on a computer-readable medium.

FIG. 8 illustrates two spirals. A first spiral 800 represents an actual trajectory associated with a non-Cartesian calibration. The second spiral 810 represents a trajectory that is not acquired in an under-sampled non-Cartesian acquisition. Point 820 lies on the non-acquired spiral 810. Points 830, 840, 850, and 860 lie on the acquired spiral 800. Example systems and methods facilitate computing a value for point 820 from points 830, 840, 850, and 860. Unlike conventional calibration systems where a pattern describing the relation between points 820, 830, 840, 850, and 860 would be moved around a single calibration acquisition, example systems and methods acquire multiple calibration acquisitions throughout time. Therefore, an exact fit can be computed for 820 from points 830, 840, 850, and 860. While FIG. 8 illustrates a spiral, one skilled in the art will appreciate that other non-Cartesian acquisitions may be employed.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method, comprising:
    controlling a parallel magnetic resonance imaging (pMRI) apparatus to acquire, from an object to be imaged, throughout a period of time, two or more non-Cartesian calibration data sets, where the two or more non-Cartesian calibration data sets are acquired at different points in time;
    controlling the pMRI apparatus to acquire an under-sampled non-Cartesian data set from the object to be imaged;
    controlling the pMRI apparatus to perform a through-time non-Cartesian GRAPPA calibration comprising computing at least one GRAPPA weight set from data in the two or more non-Cartesian calibration data sets; and
    controlling the pMRI apparatus to reconstruct an image of the object to be imaged from the under-sampled non-Cartesian data set where a value for a point missing from k-space in the under-sampled non-Cartesian data set is computed using the GRAPPA weight set as calibrated and applied for the missing point.

2. The method of claim 1, where the two or more non-Cartesian calibration data sets include data acquired for the same k-space points acquired at two or more points in time.

3. The method of claim 1, where the through-time non-Cartesian GRAPPA calibration computes a value for a point missing from k-space in the under-sampled non-Cartesian data set using a GRAPPA weight set calibrated and applied for the missing point.

4. The method of claim 3, where the GRAPPA weight set is computed from data selected from each of the two or more non-Cartesian calibration data sets.

5. The method of claim 1, where the through-time non-Cartesian GRAPPA calibration computes a value for a point missing from k-space in the under-sampled non-Cartesian data set using a GRAPPA weight set calibrated from the two or more non-Cartesian calibration data sets and from at least one other point in k-space in the two or more non-Cartesian calibration data sets, the other point in k-space being different from the point missing from k-space.

6. The method of claim 3, where the GRAPPA weight set is computed from data selected from less than all of the data in the two or more non-Cartesian calibration data sets.

7. The method of claim 1, where controlling the pMRI apparatus to reconstruct the image comprises controlling the pMRI apparatus to reconstruct the image in real-time.

8. The method of claim 1, where the object to be imaged is one of, a beating heart, and a region of a human vasculature in which blood is flowing, and where the two or more non-Cartesian calibration data sets are acquired from the object to be imaged throughout a period of time during which the object to be imaged moves.

9. The method of claim 1, where the non-Cartesian calibration data sets are associated with one or more of, a radial acquisition, a spiral acquisition, and a rosette acquisition.

10. The method of claim 1, where a non-Cartesian calibration data set comprises two or more acquisition path elements for which calibration data is acquired, and where the GRAPPA weight set is computed from all the elements acquired in the non-Cartesian calibration data set.

11. The method of claim 1, where a non-Cartesian calibration data set comprises two or more acquisition path elements for which calibration data is acquired, and where the GRAPPA weight set is computed from less than all the elements acquired in the non-Cartesian calibration data set.

12. The method of claim 1, where the non-Cartesian calibration data sets are fully sampled data sets.

13. The method of claim 1, where a non-Cartesian calibration data set comprises two or more acquisition path elements for which calibration data is acquired, and where the two or more acquisition path elements are selected as a function of elements that will be used to reconstruct the image.

14. The method of claim 1, where a non-Cartesian calibration data set comprises two or more acquisition path elements for which calibration data is acquired, and where the two or more acquisition path elements include at least the one of the elements that will be used to reconstruct the image.

15. The method of claim 1, comprising controlling the pMRI apparatus to acquire all the non-Cartesian calibration data sets and then to acquire the under-sampled non-Cartesian data set.

16. The method of claim 1, comprising controlling the pMRI apparatus to interleave acquisition of the non-Cartesian calibration data sets and the under-sampled non-Cartesian data set.

17. The method of claim 1, comprising controlling the pMRI apparatus to perform the through-time non-Cartesian GRAPPA calibration based, at least in part, on at least one piece of region based calibration data.

18. A non-transitory computer-readable medium storing computer-executable instructions that when executed by a computer control the computer to perform a method, the method comprising:

controlling a parallel magnetic resonance imaging (pMRI) apparatus to acquire, from an object to be imaged, throughout a period of time, two or more non-Cartesian calibration data sets, where the two or more non-Cartesian calibration data sets are acquired at different points in time;

controlling the pMRI apparatus to acquire an under-sampled non-Cartesian data set from the object to be imaged; and controlling the pMRI apparatus to reconstruct an image of the object to be imaged from the under-sampled non-Cartesian data set based, at least in part on a through-time non-Cartesian GRAPPA calibration, where a value for a point missing from k-space in the under-sampled non-Cartesian data set is computed using a GRAPPA weight set calibrated and applied for the missing point, where the GRAPPA weight set is computed from data in the two or more non-Cartesian calibration data sets.

19. An apparatus usable with a parallel magnetic resonance imaging apparatus, comprising:

a non-Cartesian dataset acquisition logic configured to control a parallel magnetic resonance imaging (pMRI) apparatus in order to acquire a plurality of non-Cartesian calibration data sets, where members of the plurality of non-Cartesian calibration data sets are acquired at different points in time;

an under-sampling acquisition logic configured to acquire an under-sampled non-Cartesian data set from the object to be imaged;

a through-time non-Cartesian GRAPPA calibration logic configured to compute a GRAPPA weight set for a point missing from k-space in the under-sampled non-Cartesian data set, where the GRAPPA weight set is calibrated for the missing point and computed from data in the plurality of non-Cartesian calibration data sets; and a reconstruction logic configured to reconstruct an image from the under-sampled non-Cartesian data set based, at least in part on the GRAPPA weight sets.

20. The apparatus of claim 19, where the through-time non-Cartesian GRAPPA calibration logic is configured to compute a value for each point missing from k-space in the under-sampled non-Cartesian data set using a GRAPPA weight set calibrated and applied for each missing point, and where the GRAPPA weight set is computed from one or more of, data selected from each member of the plurality of non-Cartesian calibration data sets, and data selected from less than each member of the plurality of non-Cartesian calibration data sets.

21. The apparatus of claim 19, where the non-Cartesian dataset acquisition logic is configured to acquire non-Cartesian calibration data sets comprising two or more acquisition path elements for which calibration data is acquired, and where the through-time non-Cartesian GRAPPA calibration logic is configured to compute the GRAPPA weight set from one or more of, all the elements acquired in the non-Cartesian calibration data sets, and less than all the elements acquired in the non-Cartesian calibration data sets.

22. The apparatus of claim 19, where the non-Cartesian dataset acquisition logic is configured to acquire a non-Cartesian calibration data set comprising two or more calibration elements for which calibration data is acquired, where the two or more calibration elements are selected based on reconstruction elements that will be used in order to reconstruct the image, and where the two or more calibration elements include at least the reconstruction elements that will be used by the reconstruction logic in order to reconstruct the image and that will be used by the through-time non-Cartesian GRAPPA calibration logic in order to compute the GRAPPA weight set.

23. A non-transitory computer-readable medium having stored thereon a data structure comprising:

a first field storing data representing a non-Cartesian calibration data set acquired by a pMRI apparatus;

a second field storing data representing an under-sampled non-Cartesian data set acquired by the pMRI apparatus; and a third field storing data representing GRAPPA weights calibrated for a point missing in the under-sampled non-Cartesian data set, where the GRAPPA weights are calculated from the non-Cartesian calibration data set.

24. The non-transitory computer-readable medium of claim 23:

where the non-Cartesian calibration data set is acquired by a pMRI apparatus performing an Archimedean spiral acquisition; and where the under-sampled non-Cartesian data set is acquired by the pMRI apparatus performing an under-sampling Archimedean spiral acquisition.

* * * * *